United States Patent Office 3,173,788

Patented Mar. 16, 1965

3,173,788
DEVELOPING POSITIVE WORKING PHOTOLITHOGRAPHIC PRINTING PLATES CONTAINING DIAZO OXIDES

Armin E. Wimmer, Vestal, and Wilfred E. Salley, Binghamton, N.Y., assignors to General Aniline & Film Corporation, New York, N.Y., a corporation of Delaware No Drawing. Filed Feb. 10, 1960, Ser. No. 7,754
1 Claim. (Cl. 96—49)

This invention relates to an improved method of processing a positive working presensitized plate comprising a light sensitive diazo oxide layer and a metal base therefor, to developing said plate into a lithographic printing plate or planographic relief for offset printing and to developer compositions which are capable of effecting such development.

Positive working photosensitive lithographic plates as generally constructed employ a lipophilic diazo oxide light sensitive material bonded to a hydrophilic metal base surface such as of aluminum. In use, the plate is exposed through a pattern to a light source such as a carbon arc or a mercury vapor lamp as a result of which the diazo oxide is decomposed in the exposed areas. The plate is then processed by removal of the decomposition products for use in the offset press.

The processing of the exposed plate requires treatment with two solutions. One of these, commonly referred to as the developer, is an alkaline solution, the purpose of which is to remove the aforesaid decomposition products. The removal of said products by the developer bares the metal base or plate at exposed areas. The remaining diazo oxide image and plate surface are given a second treatment with an acid-fixing solution in order to neutralize or halt the developer activity and, at the same time, effect desensitization of the aluminum surface at the exposed areas. After processing of the plate as above described, it is placed in an offset press, treated with inks or lacquers, gum solutions and the like, in the usual way for the production of printed copies.

Plates of the kind under consideration here are based on a disclosure in Annalen der Chemie 556 (65–90), 1944, wherein is shown the photodecomposition of 2,1 or 1,2-diazo oxides into a ketene substituted cyclopentadiene or indene which in the presence of water is transformed into a cyclopentadiene or indene carboxylic acid. Thus, U.S. Patent 2,772,972 discloses the use of naphthalene series diazo oxides on lacquered surfaces comprising a copolymer of maleic anhydride-vinylalkyl ether for the purpose of producing positive working paper base offset plates having exceptionally high sensitometric contrast. For the system employed there, organic polyhydroxy compounds were used as developing agents which presumably react with the reactive ketene function in the exposed areas, thus solubilizing and permitting removal of the light-struck sensitizer in such areas.

Metal base offset plates, on the other hand, employ aqueous inorganic bases such as sodium carbonate and the like for removing the photoproduct leaving behind a photoreactant which serves as a printing image, thus yielding a positive-working system. In this method of processing, presumably the ketene function induced by light is hydrolyzed to an acid by the action of the developer solution and the photoproduct is rendered soluble as the sodium salt of the carboxylic acid function which it carries. Such plates are described, for instance, in G.P. 854,890.

In the manufacture of aluminum metal offset plates, a sheet of aluminum foil (which may vary in thickness between .003 and 0.020″) is cleaned, usually grained mechanically and sometimes given an additional chemical treatment following the graining step for the purpose of increasing the hydrophilic nature of the aluminum surface. Following these preliminary treatments, the surface is sensitized usually with a solvent solution containing the diazo oxide.

Although the photolithographic plates prepared in accordance with the teachings of the prior art are generally satisfactory, they suffer from various drawbacks.

For example, diazo oxide sensitized positive working metal plates possess undesirably low contrast for optimum conventional photolithographic use. This is a serious limitation since very high sensitometric contrast is desirable if the line or half-tone originals are to be reproduced satisfactorily.

A second difficulty arises from the fact that it is most desirable to have an extremely uniform water receptivity over the surface of the plate and to have this water receptivity of a relatively high order. Under these circumstances, with plates which have been chemically treated to produce a high degree of hydrophilic character in the grained aluminum surface, it becomes difficult to attain a sufficiently high degree of adhesion between the sensitizing composition and the plate surface itself. Combined with the continuous-tone properties of the diazo image, processing or graining streaks are prone to occur.

Further, the toughness and tenacity of the diazo image depends in part on its molecular weight and chemical constitution. If sufficient tenacity and toughness is built into the diazo image, then some difficulty may be experienced in securing a completely clean and ready development of the diazo image in the exposed regions without prolonged processing. Furthermore, the use of rather vigorous developing agents deleteriously affect the skin resulting in dermatitis and related symptoms. On the other hand, if a desirable diazo oxide on a thoroughly hydrophilic aluminum surface is developed with aqueous inorganic bases in accordance with the teachings of the prior art, the resulting image will usually be friable to a degree and thus prone to fail in long runs on the offset press. This may be due to the fact that the image areas have invariably received at least a slight exposure to light. If the original employed was not of high opacity, these areas may have received appreciable exposure to light. For such reasons or by virtue of a slight thermal instability of the diazo oxide material itself, the image areas may contain a small amount of photodecomposition product. Under the action of the inorganic bases used heretofore, we believe that the image areas tend to become permeated and, to a degree, slightly honeycombed by these vigorous agents. Due to the size of the ions involved, the layer becomes somewhat swollen and mechanically ruptured by the presence of, for instance, sodium ion.

Still another disadvantage of the processing compositions and procedures used heretofore is that they may adversely affect the ink receptivity of the image perhaps for the reasons just outlined above. In any event, prolonged processing with such inorganic base compositions may lead to a "blindness" of the image which may be streaky and not entirely uniform over the surface and thus yielding a particularly undesirable defect.

Still another disadvantage is the fact that in many cases the developer compositions employed are themselves sufficiently alkaline or active to bring about a change towards the more hydrophilic side in the character of the metal surface during the development process. Sodium carbonate, which is used as a developer for the light sensitive diazo oxide layers described in G.P. 907,738, falls in the aforesaid category. Sodium aluminate is employed in U.S.P. 2,208,703. It is difficult or in some cases impossible to remove completely the developer composition from the bared metal surface which, as noted above, may have been irreversibly altered.

It is the aim of this invention to present procedures and compositions for developing diazo oxide metal plates to rid the processing from the drawbacks outlined above. With the developer compositions described herein, we produce images having very high sensitometric contrast. Further, by manipulating the concentration of our developer compositions, we may change the contrast characteristics of our plates. With the compositions which we shall disclose, the image region is not attacked or otherwise altered so that its strength and toughness is impaired. In fact, with our compositions, we actually considerably increase the toughness and adhesion of the diazo oxide layer to the underlying metal surface. Further, we do not impair the ink receptivity of the diazo oxide image layers with our compositions but actually increase such receptivity. The treatment does not undesirably alter the surface of the metal during processing, so that conversion processes, such as those outlined above, are possible. With certain of our preferred developer compositions, all of the constituents of the processing composition are volatile and evaporate away from the metal surface.

The objects of this invention are achieved by developing an exposed diazo oxide plate by using as the developer composition therefor an essentially aqueous solution of an ammonium salt. Our developer solutions remove only those portions of the diazo oxide sensitive layer which have been exposed to radiation. The image regions corresponding to the unexposed areas remain unaffected in contrast to the stronger formulations used heretofore. As a consequence of the highly selective nature of our developer compositions in removing only the irradiated diazo oxide, a printing plate is produced capable of yielding very sharply defined images. This property is a valuable asset in line copy work where very high sensitometric contrast is required.

In evolving our developer solutions, we have ascertained that they can be used under neutral or even somewhat acidic conditions. This is an unexpected find over the prior art which has always taught that exposed diazo oxide plates must be processed or developed using mineral bases. The fact that ammonium salt developers are without any deleterious effect on the unexposed diazo oxide image is believed to be attributable to their essentially neutral properties. In fact, ammonium salt developer compositions actually increase the toughness and adhesion of the diazo oxide layer to the underlying metal surface and this constitutes another unexpected, although advantageous, feature of our invention.

We have not, as yet, determined a mechanism or explanation as to why our developers should exhibit this toughening of the unexposed diazo oxide layer. In any event, such developers are highly desirable in that they are capable of completely removing the exposed and, therefore, transformed diazo oxide while, at the same time, exhibiting no action whatsoever on the unexposed diazo oxide. As a consequence, a printing plate is obtained thereby capable of producing extremely sharp prints with highly differentiated areas of ink receptivity and non-ink receptivity.

The developers as described herein are especially useful in processing photolithographic plates of the type wherein the aluminum base is prepared and set forth in U.S.P. 2,208,703. This patent describes a process for treating an aluminum sheet with alkali metal aluminates in order to render the metal surface receptive of greasy printing inks. Sheet aluminum treated in this manner is an excellent base for the production of presensitized plates employing a diazo oxide as the light sensitive material. When such plates are exposed and processed, they retain greasy images very tenaciously whereas superficial contacting grease such as finger prints, and the like adheres only slightly. However, if strongly alkaline developers are employed, the retention of superficial greasy marks is greatly increased. As a consequence, these contaminants cannot be readily removed by fountain or etching solutions. On the other hand, our ammonium salt developers, when employed to process presensitized plates of the type described above, do not alter the metal surface. Therefore, superficial greasy marks or contaminants can readily be removed by treatment with etching solutions in the manner well known.

As has previously been pointed out, our developer formulations are neutral or slightly acidic and in this respect are diametrically opposite to the highly alkaline developers of the prior art. We have found, for instance, that our developers are effective at a pH of 6.4 units or greater. Ordinarily, satisfactory results ensue if a developer solution is used which is essentially near the neutral point. Even at a relatively high pH, our developer solutions are much more gentle than prior art formulations at the same basicity. For instance, a photolithographic plate wherein the diazo oxide is a benzidene sulfonamide of the naphthalene series can be developed only with very mildly alkaline solutions such as aqueous sodium bicarbonate or sodium borate since more basic agents rapidly attack the image. However, a similar plate can be developed very readily with an ammonium salt developer of the type proposed herein such as aqueous ammonium carbonate at a pH in excess of 9 without any adverse effect on the image area.

As referred to above, our developer solutions can be prepared from those ammonium salts capable of yielding aqueous solution wherein the pH is about 6.4 units or greater. Ammonium salts which share this property are, in general, those composed of an ammonium ion in association with the ion of a suitably weak acid. Typical ammonium salts suitable for practicing our invention include ammonium carbonate, ammonium bicarbonate, ammonium phosphate, ammonium sulfite, ammonium acetate, ammonium fluoride, ammonium oxalate, ammonium gluconate, ammonium dichromate, etc.

The aluminum surfaces which are used as the base or support for presensitized diazo oxide printing plates as described herein are described in greater detail in various patents and publications and in this connection reference is made to U.S. Patents 2,003,268, 2,772,972, Example XVI; 2,754,209, Examples I and X; 2,230,982, 2,208,703 and 2,129,071.

A wide variety of aluminum surfaces which have been subjected to various treatments (chemical or otherwise) for the purpose of inducing grain or hydrophilic character can be successfully employed, although we prefer plates treated as outlined in the first example. Thus, the plates made as described in U.S. Patents 2,003,268, 2,772,972, 2,754,209, Example I; 2,754,209, Example X; 2,230,982, 2,208,703 and 2,129,071 can be exchanged for the surface disclosed in the examples.

The diazo oxide which we employ is usually of high molecular weight and lipophilic in character. Such diazo oxides may be formed by esterification or amidation of 2-diazo-1-naphthol-5-sulfonyl chlorides or 2-naphthol-1-diazo-5-sulfonyl chlorides with amines or alcohols or with more complex compounds which possess a saturated, unconjugated, non-polar molecule such as rosin amines, rosin alcohols and their derivatives.

Diazo oxides useful for practicing the invention include the following:

(1) 2-diazo-1-naphthol-5-sulfuric acid ethyl ester
(2) 2-diazo-1-naphthol-5-sulfuric acid methyl ester
(3) 2-diazo-1-naphthol-5-sulfuric acid phenyl ester
(4) 2-diazo-1-naphthol-5-sulfuric acid naphthyl ester
(5) 2-diazo-1-naphthol-5-sulfuric acid butyl ester
(6) 2-diazo-1-naphthol-5-sulfuric acid benzyl ester
(7) 1-diazo-2-naphthol-5-sulfuric acid ethyl ester
(8) 1-diazo-2-naphthol-5-sulfuric acid phenyl ester
(9) 2-diazo-1-naphthol-5-sulfonamide
(10) 2-diazo-1-naphthol-5-N-methyl-sulfonamide
(11) 2-diazo-1-naphthol-5-N-(carbmethoxymethyl)-sulfonamide

(12) 2-diazo-1-naphthol-5-N-(carbethoxymethyl)-sulfonamide
(13) 2-diazo-1-naphthol-5-N-dimethylsulfonamide
(14) 2-diazo-1-naphthol-5-N-butylsulfonamide
(15) 2-diazo-1-naphthol-5-N-dibutylsulfonamide
(16) N-dehydroabietyl-6-diazo-5(6)-oxo-1-naphthalenesulfonamide
(17) N-dehydroabietyl-N-2-hydroxyethyl-6-diazo-5(6)-oxo-1-naphthalenesulfonamide
(18) N,N'-didehydroabietyl-N,N'-ethylene bis [6-diazo-5(6)-oxo-1-naphthalenesulfonamide]

The following formulae are also representative of suitable diazo oxides for use described herein:

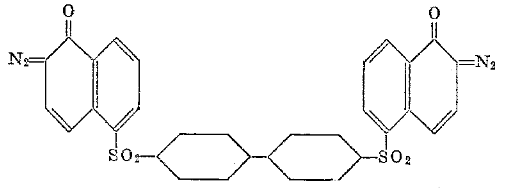

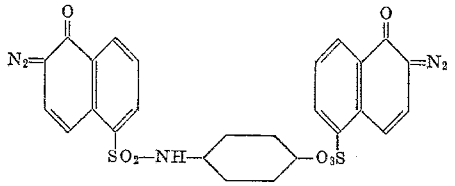

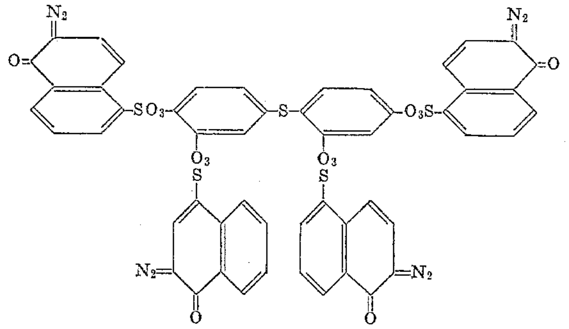

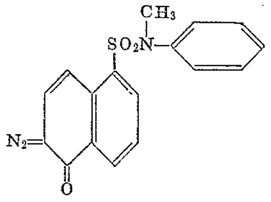

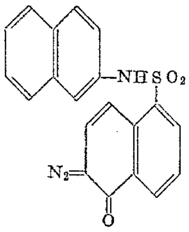

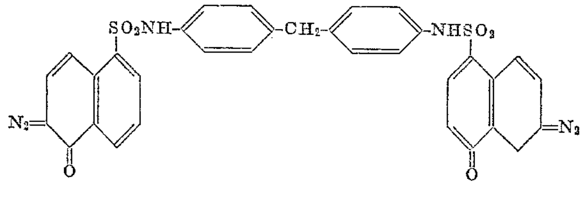

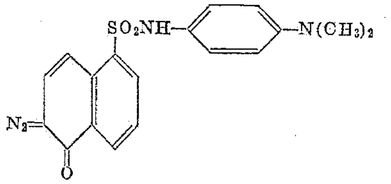

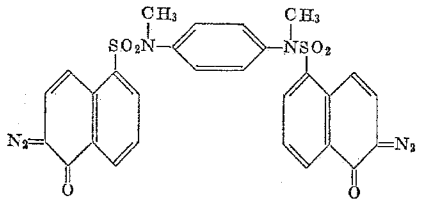

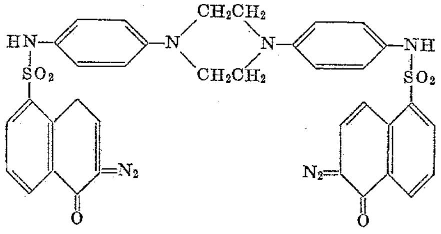

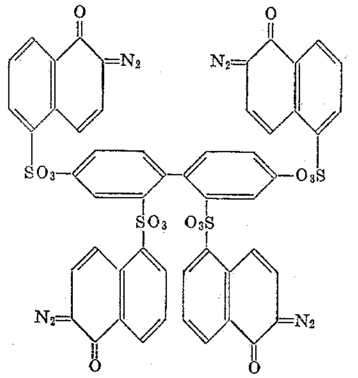

Other diazo oxide structures include:

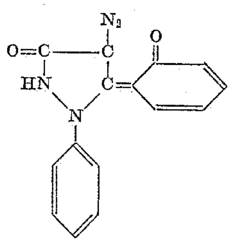

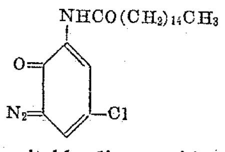

Additional and suitable diazo oxides are described in German Patents 865,109, 879,203, 872,154 and U.S.P. 2,702,243.

The invention is illustrated in greater detail by reference to the following examples, the inclusion of which is for purposes of illustration only and such examples are not to be construed as limiting the invention.

*Example I*

A sheet of aluminum foil 0.006 inch in thickness was treated in a proprietary bath of a type manufactured by the Diversey Company, Chicago 13, Ill., and purchased from them as 202 Aluminum Soak Tank Cleaner. After a three minute immersion in the cleaning bath, the plate was next grained by a sandblasting technique.

Following the graining operation, the plate was sensitized with an 18% solution of N,N'-(4,4'-biphenylene) bis[6(5H)-diazo-5(6H)-oxo-1-naphthalenesulfonamide] and dried.

After exposure beneath a positive original, the plate was developed in a 13% aqueous solution of ammonium carbonate by rubbing the plate with a cotton swab moistened with a developing solution. To a degree, the effect of over and under exposure could be compensated for by changing the concentration of the ammonium carbonate thus enabling one to control the contrast of the plate within limits. We have found that the more dilute ammonium carbonate solution operates to decrease the contrast of the plate whereas the reverse is obtained with the more concentrated developer solution. This unexpected behavior of our ammonium salt developers is diametrically opposite to that of the prior art alkaline developers. In the latter case, a more concentrated solution possesses greater developer activity and plates developed therein exhibit reduced contrast whereas plates developed in dilute solutions of the prior art alkalies are characterized by increased contrast. Just why the ammonium salt developers of the invention should act in a manner diametrically opposite to that of the developers of the prior art has not, as yet, been ascertained.

The developed plate as obtained above can be processed for conversion to a printing plate for use in the offset press by various methods which are known to the art. For instance, following exposure, a developing ink such as that manufactured by Lithographic Chemicals & Supply Company under the trade name Lith-Kem-Ko Developing Ink, Heavy Jiffy, can be applied over the entire surface of the plate and subsequently the exposed regions together with the associated ink removed from the plate by treatment with ammonium carbonate. Following exposure and development, the plate may be processed further in any one of a number of alternative ways. Thus, after development, the plate may be simply gummed with an aqueous solution of slightly acidic gum arabic or other suitable polycarboxylic desensitizing polymer and is then ready for the press. The so obtained plate will yield upwards to 20,000 copies before even the slightest wear is detectable. This is many times the copies that could be obtained if the identical plate were processed in the alkaline developers of the prior art.

The light sensitive diazo oxide used in preparing the above described presensitized plate was synthesized in the following manner:

A stirred flask was charged with 26.8 g. of 6(5H)-diazo-5(6)-oxo-1-naphthalenesulfonamide, 160 ml. of dioxane and 13.7 g. of N,N'-dimethyl-p-phenylenediamine dioxalate, followed by 66 ml. of sodium carbonate solution, 3 N, in four portions. The reaction mixture which spontaneously had warmed slightly was heated to 51° C. and then allowed to stir four hours while cooling to 29° C. The product, after being filtered, was washed well and dried under reduced pressure.

*Example II*

In this example, the developer was a 10% aqueous solution of ammonium phosphate. The procedure and results obtained thereby paralleled those of Example I.

*Example III*

The procedure of Example I was carried out but in this instance the developer was a 10% solution of ammonium bicarbonate, pH 8.6. The results were essentially the same as obtained in Example I wherein the developer was ammonium carbonate.

*Example IV*

In this example, the ammonium carbonate of Example I was replaced by a 10% solution of ammonium sulfite, pH 8.3. The procedure and the results obtained thereby approximated those of the first example.

*Example V*

The developer in this instance was a 10% solution of ammonium acetate and the pH 7.8. The procedure and results were in line with those obtained in the first example.

*Example VI*

In this example, the developer was a 10% solution of ammonium fluoride, the pH of which was 7.3. The procedure and results paralleled those of the first example.

*Example VII*

In this instance, the developer was ammonium oxalate and a 2% aqueous solution was employed operating at a pH of 6.5. This example illustrates an application wherein the developers can be used in relatively dilute solutions and at a low pH. The procedure and results otherwise were commensurate with the results obtained in Example I.

*Example VIII*

In this instance, the ammonium carbonate of Example I was replaced by ammonium gluconate as a 10% solution, pH 7.1. The procedure and results obtained were essentially the same as obtained in the first example.

*Example IX*

A 10% solution of ammonium bichromate, pH 6.7, served as the developer in this example. The procedure as well as the results obtained thereby closely paralleled those of the first example.

In the following four examples, X to XIII, the presensitized plates are prepared from diazo oxides of a type known to be normally quite resistant to development by the alkaline developer solutions of the prior art. However, when such presensitized plates having such difficulty, developable diazo oxides were processed in the ammonium salt developers; good image discrimination and rendition were obtained in every case.

*Example X*

Following the procedure as given in Example I, a presensitized plate was prepared wherein the sensitizer of the first example was replaced by one having the following structural formula:

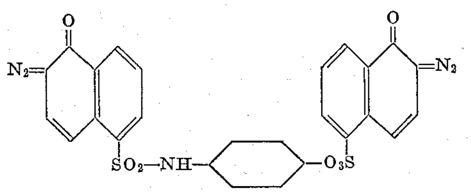

After exposure, the plate was developed with a 13% aqueous ammonium carbonate solution as previously described. Development was extremely clean-cut and a good image having excellent discrimination and sharpness was obtained.

The diazo oxide used in this example was prepared by charging a flask with 150 ml. of dioxane, 50 ml. of water, 27.0 g. of 6(5H)-diazo-5(6H)-oxo-1-naphthalene sulfonyl chloride and 5.0 g. of p-aminophenol. To this solution, at room temperature, was added 35 ml. of a 3 N sodium carbonate solution. The resulting mixture was then heated to 50–55° C. for ½ hour and then allowed to cool after which it was poured into 2 liters of water acidified with hydrochloric acid. The red solid which separated, having the above structure, was collected and recrystallized from aqueous ethanol.

*Example XI*

Following the procedure of Example I, a presensitized plate was prepared using as the light sensitive diazo oxide a compound of the following formula:

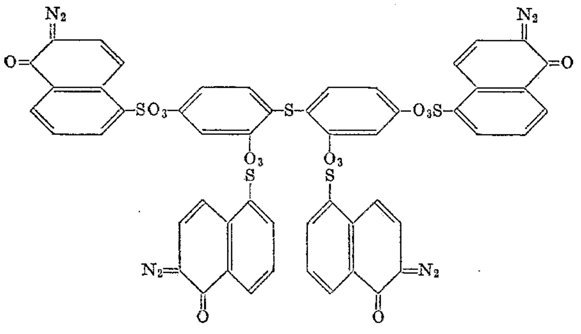

After exposure and development with ammonium carbonate solution, an excellent printing plate was thereby obtained capable of producing prints of high resolution and definition.

The diazo oxide used as the light sensitive material in this example was synthesized by charging a flask with 50 ml. of dioxane, 5.0 g. of 4,4'-thiodiresorcinol, 20 ml. of water and a solution of 21.6 g. of 6(5H)-diazo-5(6H)-oxo-1-naphthalene sulfonyl chloride in 125 ml. of dioxane. Over a period of ½ hour, 100 ml. of 3 N sodium carbonate solution was added dropwise. The temperature rose to about 35° C. after which the solution was heated at 50–60° C. for ½ hour; at the end of this period, the dark precipitate had separated out. The mixture was cooled and diluted to four times its volume of water. The solid was collected, triturated with sodium hydroxide solution, filtered, washed until neutral and then dried under reduced pressure. The product weighed 19.4 g.

*Example XII*

A presensitized plate was prepared in accordance with the procedure of Example I except that in this instance the diazo oxide used as the light sensitive material had the following formula:

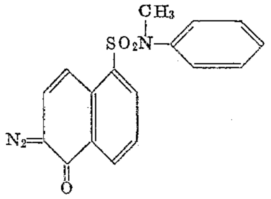

After exposure, the plate was developed in ammonium carbonate solution and, in general, processed as described in the previous examples. The printing plate thereby obtained was characterized by great durability and yielded prints of high resolution and clarity.

The aforesaid diazo oxide used as the light sensitive material for the plate was made by charging a flask containing 2000 ml. of methanol under agitation with 88 g. of 6(5H)-diazo-5(6H)-oxo-1-naphthalene sulfonyl chloride. To this mixture was then added 72 ml. of N-methylaniline in 400 ml. of methanol. The reaction product was refluxed for 3 hours after which it was cooled and filtered. The solid obtained was recrystallized from 7 liters of methanol. The purified product weighed 85.9 g. and consisted of reddish crystals melting at 143–5° C.

*Example XIII*

A presensitized plate was prepared as set forth in Example I but using as a light sensitive diazo oxide a material having the following formula:

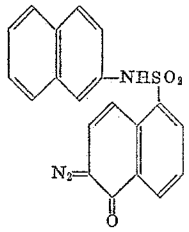

The so obtained plate was then exposed, developed and converted to a plate for use in the offset press as depicted above under Example X. The prints produced from this plate were characterized by high degree of resolution and definition.

The diazo oxide used as the light sensitive component in the above described plate was prepared by charging a flask with 21 g. of 2-naphthylamine dissolved in 150 ml. of warm benzene. While this mixture was stirring, there was added thereto and in dropwise manner a hot filtered solution of 30 g. of 6(5H)-diazo-5(6H)-oxo-1-naphthalene sulfonyl chloride in 150 ml. of benzene. After the addition was complete, the reaction mixture was cooled and the solid then separated out which was removed by filtration. The benzene filtrate was then evaporated and the residual solid was extracted with hydrochloric acid and washed with water. After crystallization from benzene, the purified product weighed 10 g. and melted at 100° C.

The presensitized plates prepared as described in the foregoing examples (X to XIII) were exposed and developed with the alkaline bases of the prior art as typified by the following.

(A)

Sodium bicarbonate-saturated solution:

| | | |
|---|---|---|
| Glim (Antara) | percent | 15 |
| Water | do | 85 |

(B)

| | | |
|---|---|---|
| Potassium tetraborate | g | 5 |
| Water | ml | 97.5 |
| Cellosolve | ml | 2.5 |

Neither of the foregoing developer compositions which exemplify the type generally used in the art were effective in developing the plates produced in accordance with Examples X to XIII. It is believed to be manifest that the comparison clearly demonstrates the superiority of our ammonium salt developers in removing the diazo oxide decomposition products in presensitized plates.

The following examples are illustrative of additional diazo oxides which can be used in preparing presensitized plates of the general type which can be developed with our ammonium salt developer.

*Example XIV*

A piece of aluminum foil was coated with a 4% solution of a diazo compound of the following formula, the procedure being essentially that employed in Example I.

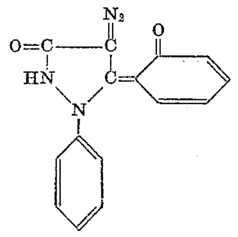

The so obtained plate was then exposed and sections cut therefrom and each developed with one of the following aqueous ammonium salt solutions:

Ammonium carbonate
Ammonium phosphate
Ammonium bicarbonate
Ammonium sulfite
Ammonium acetate
Ammonium fluoride
Ammonium oxalate
Ammonium gulconate
Ammonium dichromate Application of the developer solution was by means of a cotton swab which was rubbed across the exposed layer. In every case, excellent development to a positive image was obtained and satisfactory runs, when the process plate was used in the offset press, were obtained in every case. The light sensitive diazo oxide used in this example was prepared by the method described in J.A.C.S. 67, 101–106 (1945).

*Example XV*

Using the procedure of Example I, a sheet of aluminum foil was coated with a 4% solution of the diazo oxide of Example V of U.S.P. 2,797,213. The plate was processed with the developer solutions described in Examples I and II and results obtained thereby approximated those of the said examples.

*Example XVI*

A sheet of aluminum foil was coated with a 4% solution of a light sensitive diazo of the following formula:

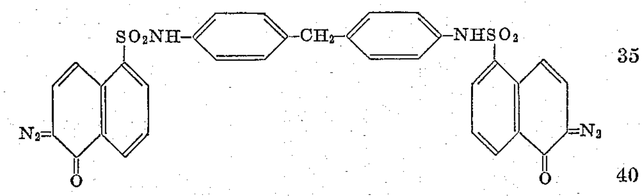

The so obtained plate was developed using the developer solutions described in Examples I and II. The results obtained with this plate parallel those of the earlier examples.

The diazo oxide used in this example was prepared by charging a flask with 26.9 g. of 6(5H)-diazo-5(6H)-oxo-1-naphthalene sulfonyl chloride, 160 ml. of dioxane and 9.9 g. of p,p-methylenedianylene at room temperature. After a slight evolution of heat, the mixture was warmed to 50° C. at which point 43.5 ml. of 3 N sodium carbonate was added over 5 minutes. The solution was stirred 1½ hours while cooling from 45° C. to 30° C. and then poured into 10 ml. of acetic acid diluted with 300 ml. of ice water. The yellow product was filtered, washed and dried. Purification was effected by dissolving an aqueous sodium hydroxide followed by precipitation with hydrochloric acid. The yield of the product amounted to 30.7 g.

*Example XVII*

An aluminum base was coated with a 4% solution of a diazo oxide of the following formula according to the procedure set forth in Example I:

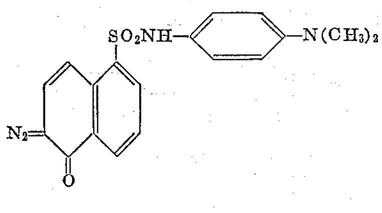

The resulting presensitized plate was then exposed and devoloped with the ammonium salt developers of the type disclosed in Examples II and III. A printing plate suitable for use in an offset press was produced and behaved similarly to the plates previously described.

The diazo oxide used as the light sensitive material in this example was prepared by treating 27 g. of 6(5H)-diazo-5(6H)-oxo-1-naphthalene sulfonyl chloride in 150 ml. of dioxane with 13.6 g. of N,N-dimethyl-p-phenylenediamine and 33 ml. of 3 N sodium carbonate. After 1 hour of stirring, the mixture was drowned in 1-liter of water and sodium carbonate added to the mixture until the pH thereof was approximately 7 to 9. The brown precipitate was filtered, washed and dried. The yield of product melting at 115° C. (dec.) was 20 g.

*Example XVIII*

A presensitized plate was produced by coating an aluminum plate with a 4% solution of a diazo oxide of the following formula, the procedure employed being that of Example I:

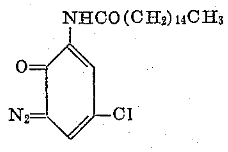

The plate was exposed and developed with the ammonium salt solutions listed in Examples II and III. The developed plate was processed for use in an offset press and printed copies were obtained having a high degree of resolution and clarity.

The diazo oxide used as the light sensitive material was prepared in the following manner: 4.3 grams of N-(5-chloro-2-hydroxy-3-nitrophenyl)palmitamide in 200 ml. of 2-propanol was reduced catalytically with hydrogen in the presence of palladium on carbon. The filtered solution was made strongly acid with concentrated aqueous hydrochloric acid, cooled with ice, and diazotized with sodium nitrite solution, 5 M. The reaction solution was diluted with an equal amount of water and the reddish-brown product was collected, washed and recrystallized from ethanol. It weighed 2 g. and melted at 81–4° C.

The N-(5-chloro-2-hydroxy-3-nitrophenyl)palmitamide was prepared by treating 20.3 g. of 2-amino-4-chloro-6-nitrophenol in 250 ml. of dioxane with a slurry of 8.4 g. of sodium bicarbonate in 25 ml. of water, followed by 27.5 g. of palmitoyl chloride. After four hours on the steam bath, the mixture was drowned in ca. 2 l. water. The slurry was acidified with hydrochloric acid and filtered. The product was washed with water and recrystallized from 2-propanol to give 23 g. of dark yellow crystals which melted at 84–7° C. A small sample after recrystallization melted at 88–90° C.

*Example XIX*

A presensitized plate was prepared in accordance with Example I and developed with the ammonium salt developers listed in Examples II and III. The results paralleled closely those obtained in the case of the previous examples.

The diazo oxide constituting the light sensitive element of the plate was prepared by dissolving 10.0 g. of cellulose hydro acetate in 150 ml. of pyridine which was then reacted with a solution of 27.0 g. of 6(5H)-diazo-5(6H)-oxo-1-naphthalene sulfonyl chloride in 135 ml. of pyridine at 0–10° C. After about 15 hours at a temperature of about 35–40° C., the reaction mixture was poured into 250 ml. of acetic acid and 200 ml. of ice water. A yellow fibrous product was isolated which was purified by repeated solution in acetone followed by reprecipitation with ether.

*Example XX*

Using the procedures given in the previous examples, a presensitized plate was prepared by coating on an aluminum base a 4% solution of a diazo oxide of the following formula:

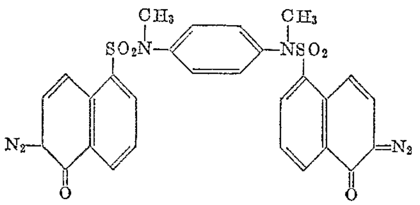

After exposure, developing and conversion to a plate for use on the offset press, results were obtained commensurate in scope with those of the previous examples.

The diazo oxide used as the light sensitive material in this example was prepared in the following manner: A stirred flask was charged with 26.8 g. of 6(5H)-diazo-5(6H)-oxo-1-naphthalenesulfonamide, 160 ml. of dioxane and 15.8 g. of N,N'-dimethyl-p-phenylenediamine dioxalate, followed by 66 ml. of sodium carbonate solution, 3N, in four portions. The reaction mixture which spontaneously had warmed slightly was heated to 51° C. and then allowed to stir four hours while cooling to 29° C. The product, after being filtered, washed well and dried under reduced pressure, weighed 27.0 g.

*Example XXI*

A presensitized plate was prepared by coating on an aluminum base a 4% solution of diazo oxide of the following formula:

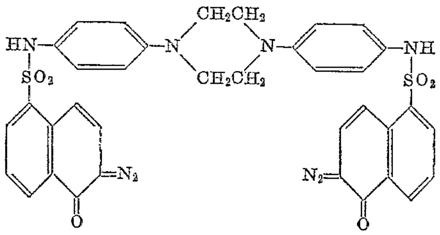

The plate was exposed and processed in the manner described in the previous examples.

The diazo oxide was prepared as follows: A flask was charged with 75 ml. of dioxane, 25 ml. of water, 7.0 g. of p,p'-(1,4-piperazinylene)dianiline, and 14.0 g. of 6(5H)-diazo-5(6H)-oxo-1-naphthalenesulfonyl chloride. To this solution was added 15 ml. of sodium carbonate, 3 N, over 15 minutes. The slurry was then heated to 50–5° C. for 45 minutes before being cooled and filtered. The product, after being washed well with dioxane and water and dried under reduced pressure, weighed 11.4 g.

*Example XXII*

An aluminum base was coated with a 4% solution of a diazo oxide of the following formula:

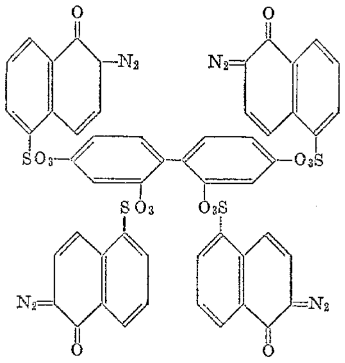

The so obtained presensitized plate was, after exposure, developed and processed in accordance with the examples above.

The diazo oxide employed in this instance was prepared as follows: A solution of 4.36 g. of 4,4'-diresorcinol, 50 ml. of dioxane, 10 ml. of water and 10 ml. of sodium carbonate solution, 3 N, was treated with a solution of 21.6 g. of 6(5H)-diazo-5(6H)-oxo-1-naphthalenesulfonyl chloride in 100 ml. of dioxane. Then, 20 ml. of water was added, followed by 80 ml. more sodium carbonate, 3 N, dropwise. The solution warmed gently and a solid separated. Water was added and the solid was isolated. It weighed 8.0 g.

We claim:

In the process of producing a positive working printing plate from a light-sensitive element comprising an aluminum base and a water hydrophobic diazo oxide layer thereon, which includes exposing with light the element to an image, thereby converting the diazo oxide in the exposed areas into a photodecomposition product and removing the latter with a developing agent to produce a water-receptive surface in the exposed areas while leaving unaffected the ink-receptive hydrophobic surface in the exposed areas, the improvement which comprises using as the developer an aqueous solution of ammonium carbonate, said solution having a pH range from 6.4 to 9.0.

References Cited in the file of this patent

UNITED STATES PATENTS

| | | |
|---|---|---|
| 2,141,103 | Brunk et al. | Dec. 20, 1938 |
| 2,228,562 | Dieterle | Jan. 14, 1941 |
| 2,489,728 | Slifkin | Nov. 29, 1949 |
| 2,702,243 | Schmidt | Feb. 15, 1955 |
| 2,709,654 | Guth | May 31, 1955 |
| 2,772,972 | Herrick et al. | Dec. 4, 1956 |
| 2,958,599 | Neugebauer | Nov. 1, 1960 |

FOREIGN PATENTS

| | | |
|---|---|---|
| 210,862 | Great Britain | Feb. 7, 1924 |
| 642,782 | Germany | Mar. 16, 1937 |
| 729,409 | Great Britain | May 4, 1955 |